United States Patent
Wakana

(10) Patent No.: US 11,007,778 B2
(45) Date of Patent: May 18, 2021

(54) DROPLET DISCHARGE APPARATUS AND CALCULATION METHOD

(71) Applicant: Gigaphoton Inc., Tochigi (JP)

(72) Inventor: Katsuhiko Wakana, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/537,533

(22) Filed: Aug. 10, 2019

(65) Prior Publication Data

US 2019/0358952 A1  Nov. 28, 2019

Related U.S. Application Data

(63) Continuation of application No. PCT/JP2017/009593, filed on Mar. 9, 2017.

(51) Int. Cl.
  *H05G 2/00* (2006.01)
  *B41J 2/125* (2006.01)

(52) U.S. Cl.
  CPC ............. *B41J 2/125* (2013.01); *H05G 2/006* (2013.01); *H05G 2/008* (2013.01)

(58) Field of Classification Search
  CPC ....... B41J 2/125; B41J 2/04561; H05G 2/006; H05G 2/008
  See application file for complete search history.

(56) References Cited

U.S. PATENT DOCUMENTS

| | | | |
|---|---|---|---|
| 4,688,048 A | 8/1987 | Uematsu et al. | |
| 2007/0228301 A1 | 10/2007 | Nakano | |
| 2011/0116604 A1* | 5/2011 | Faubel | H05G 2/003 378/143 |
| 2014/0246607 A1* | 9/2014 | Bykanov | H05G 2/008 250/504 R |
| 2014/0253716 A1* | 9/2014 | Saito | H05G 2/005 348/87 |
| 2016/0037616 A1* | 2/2016 | Saito | H05G 2/005 250/504 R |
| 2016/0234920 A1* | 8/2016 | Suzuki | H05G 2/008 |
| 2018/0007771 A1* | 1/2018 | Satou | H05G 2/005 |
| 2019/0137882 A1* | 5/2019 | Lai | H05G 2/008 |

(Continued)

FOREIGN PATENT DOCUMENTS

| | | |
|---|---|---|
| EP | 214855 A2 | 3/1987 |
| JP | S55-041239 A | 3/1980 |
| JP | S62-174163 A | 7/1987 |

(Continued)

OTHER PUBLICATIONS

International Search Report issued in PCT/JP2017/009593; dated Jun. 6, 2017.

(Continued)

*Primary Examiner* — Wyatt A Stoffa
(74) *Attorney, Agent, or Firm* — Studebaker & Brackett PC

(57) ABSTRACT

A droplet discharge apparatus may include a droplet discharge unit configured to discharge droplets of a target substance stored in a tank at intervals through an opening of a nozzle connected to the tank, a speed sensor configured to measure the speed of a droplet discharged from the droplet discharge unit, and a calculation unit configured to calculate the volume of the target substance consumed per unit time, based on cross-sectional area of the opening of the nozzle and the speed of the droplet.

18 Claims, 9 Drawing Sheets

(56) References Cited

U.S. PATENT DOCUMENTS

2020/0103433 A1\* 4/2020 Lai ............................ G01P 5/20

FOREIGN PATENT DOCUMENTS

| JP | 2007-266234 A | 10/2007 |
|----|---------------|---------|
| JP | 2014-175474 A | 9/2014 |
| WO | 2014/189055 A1 | 11/2014 |

OTHER PUBLICATIONS

Written Opinion issued in PCT/JP2017/009593; dated Jun. 6, 2017.
An Office Action; "Notice of Reasons for Rejection" mailed by the Japanese Patent Office dated Jul. 14, 2020, which corresponds to Japanese Patent Application No. 2019-504248 and is related to U.S. Appl. No. 16/537,533 with English language translation.

\* cited by examiner

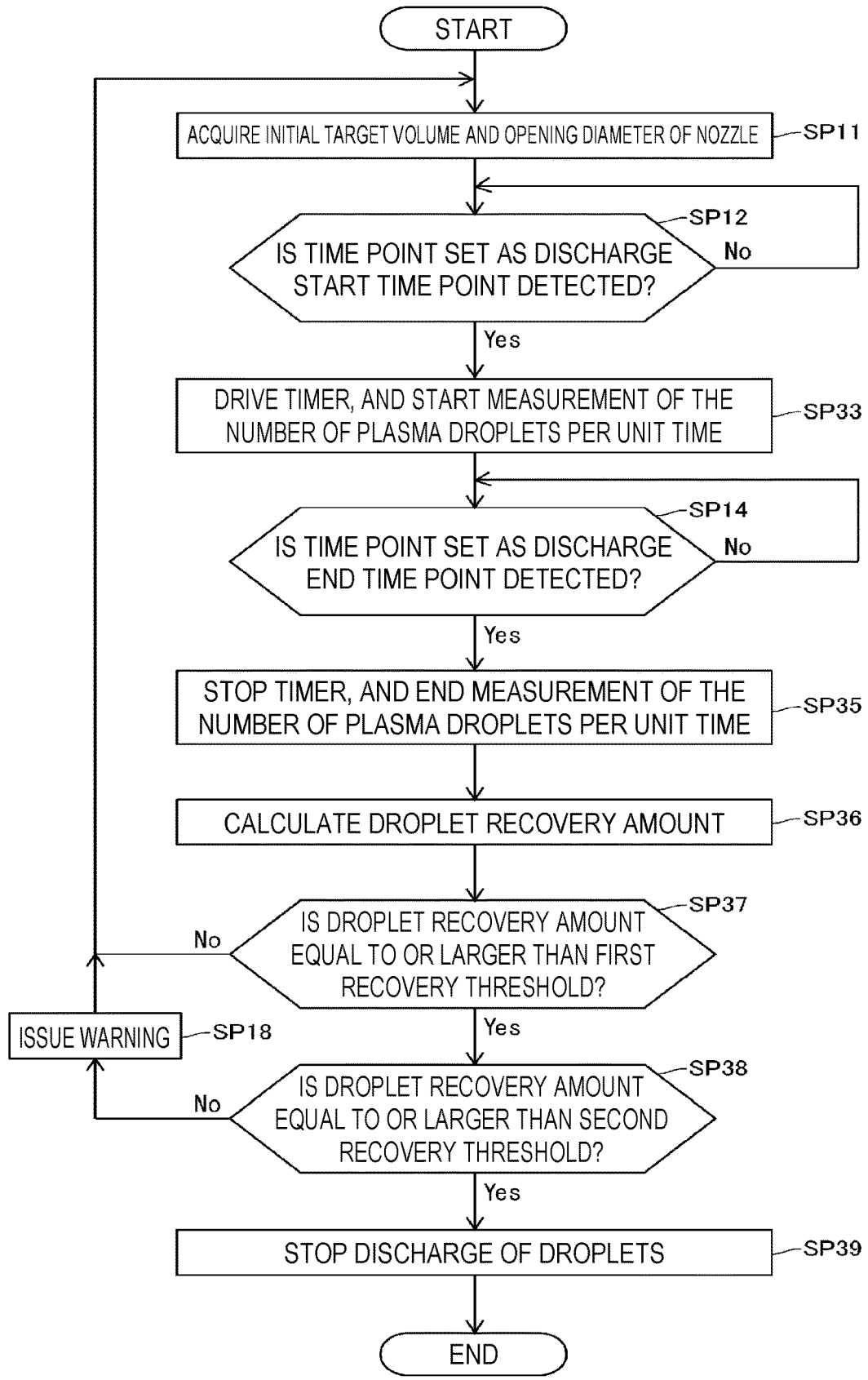

DROPLET DISCHARGE APPARATUS AND CALCULATION METHOD

CROSS-REFERENCE TO RELATED APPLICATIONS

The present application is a continuation application of International Application No. PCT/JP2017/009593 filed on Mar. 9, 2017. The content of the application is incorporated herein by reference in its entirety.

BACKGROUND

1. Technical Field

The present disclosure relates to a droplet discharge apparatus and a calculation method.

2. Related Art

In recent years, along with microfabrication in the semiconductor manufacturing process, micronization of transfer patterns in photolithography of the semiconductor manufacturing process is developed rapidly. In the next generation, microfabrication of 20 nm or smaller will be required. Accordingly, it is expected to develop an exposure apparatus in which a device for generating extreme ultraviolet (EUV) light having a wavelength of about 13 nm and a reduced projection reflective optics are combined.

As EUV light generation apparatuses, three types of apparatuses are proposed, namely, a laser produced plasma (LPP) type apparatus that uses plasma generated when a target substance is irradiated with laser light, a discharge produced plasma (DPP) type apparatus that uses plasma generated by discharging, and a synchrotron radiation (SR) type apparatus that uses orbital radiation light.

LIST OF DOCUMENTS

Patent Document

Patent Document 1: Japanese Unexamined Patent Application Publication No. 2014-175474

SUMMARY

A droplet discharge apparatus according to one embodiment of the present disclosure may include a droplet discharge unit configured to discharge droplets of a target substance stored in a tank at intervals through an opening of a nozzle connected to the tank, a speed sensor configured to measure a speed of a droplet discharged from the droplet discharge unit, and a calculation unit configured to calculate the volume of the target substance consumed per unit time, based on cross-sectional area of the opening of the nozzle and the speed of the droplet.

A calculation method according to an aspect of the present disclosure may include measuring a speed of a droplet of a target substance stored in a tank discharged at intervals through an opening of a nozzle connected to the tank, and calculating a volume of the target substance consumed per unit time, based on cross-sectional area of the opening of the nozzle and the speed of the droplet.

BRIEF DESCRIPTION OF THE DRAWINGS

Some embodiments of the present disclosure will be described below as mere examples with reference to the accompanying drawings.

FIG. 9 is a flowchart illustrating a droplet recovery amount calculation routine of a calculation unit that calculates a droplet recovery amount.

DESCRIPTION OF EMBODIMENTS

1. Overview
2. Description of extreme ultraviolet light generation system
  2.1 Overall configuration
  2.2 Operation
3. Description of droplet discharge apparatus of comparative example
  3.1 Configuration
  3.2 Operation
  3.3 Problem
4. Description of droplet discharge apparatus of embodiment
  4.1 Configuration
  4.2 Operation
  4.3 Effect Hereinafter, embodiments of the present disclosure will be described in detail with reference to the drawings.

The embodiments described below illustrate some examples of the present disclosure, and do not limit the contents of the present disclosure. All of the configurations and the operations described in the embodiments are not always indispensable as configurations and operations of the present disclosure.

It should be noted that the same configuration elements are denoted by the same reference signs, and overlapping description is omitted.

1. Overview

An embodiment of the present disclosure relates to an extreme ultraviolet light (EUV) generation system for generating extreme ultraviolet light. In the following description, extreme ultraviolet light may be referred to as EUV light, and a controller for generating EUV light may be referred to as an EUV light generation controller.

2. Description of Extreme Ultraviolet Light Generation System

2.1 Overall Configuration

Figure 1:
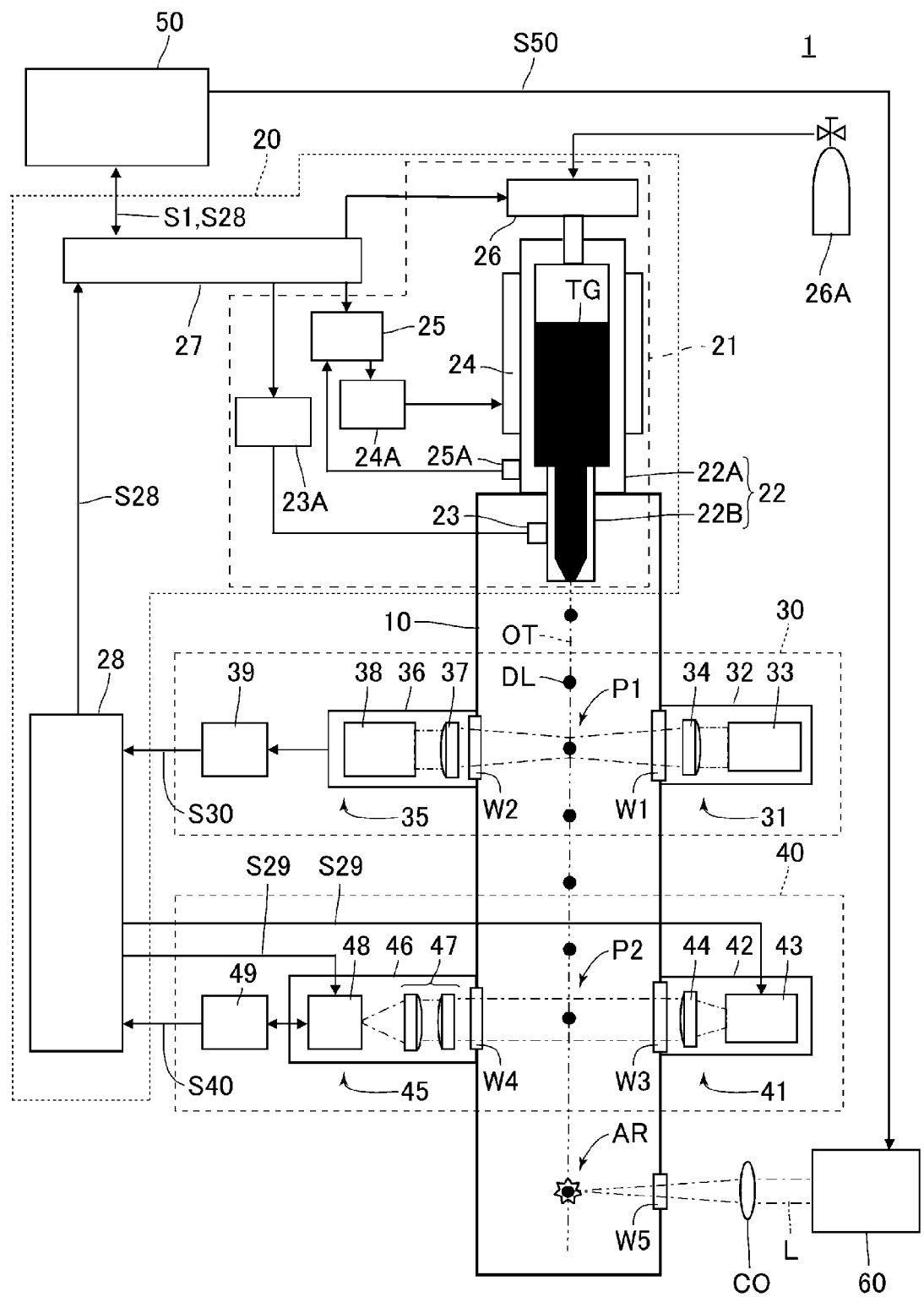
FIG. 1 is a schematic diagram illustrating a schematic configuration of the entire extreme ultraviolet light generation system.

FIG. 1 is a schematic diagram illustrating a schematic configuration of the entire extreme ultraviolet light generation system. As illustrated in FIG. 1, an extreme ultraviolet light generation system 1 includes a chamber 10. The chamber 10 is a sealable and evacuable container. A wall of the chamber 10 has at least one through hole. In the example illustrated in FIG. 1, five through holes are provided and are covered by windows W1 to W5, respectively.

The extreme ultraviolet light generation system 1 also includes a droplet discharge apparatus 20. The droplet discharge apparatus 20 is configured to discharge droplets DL to the inside of the chamber 10 at intervals by a continuous jet method.

For example, the droplet discharge apparatus 20 may be configured of a droplet discharge unit 21, a target generation controller 27, and a calculation unit 28. The droplet discharge unit 21 may be configured of a target injector 22, a piezoelectric element 23, a heater 24, a temperature controller 25, and a pressure regulator 26.

The target injector 22 has a tank 22A that is movably supported relative to the chamber 10, and a nozzle 22B connected to the tank. In the tank 22A, a target substance TG is stored. The material of the target substance may include, but not limited to, any of tin, terbium, gadolinium, lithium, and xenon, or a combination of any two or more of them. At least the tip portion of the nozzle 22B is disposed in the chamber 10.

The piezoelectric element 23 is provided on the outer surface of the nozzle 22B of the target injector 22. The piezoelectric element 23 is driven by electric power supplied from a piezoelectric power source 23A, and oscillates at a predetermined oscillation cycle. The heater 24 is provided on the outer surface of the tank 22A of the target injector 22. The heater 24 is driven by electric power supplied from a heater power source 24A, and heats at a temperature designated by the temperature controller 25.

The temperature controller 25 controls the heater 24 such that the temperature detected by the temperature sensor 25A provided on the outer surface of the tank 22A of the target injector 22 becomes a predetermined temperature. The predetermined temperature is equal to or higher than the melting point temperature of the target substance TG stored in the tank 22A of the target injector 22.

The pressure regulator 26 depressurizes the gas supplied from a gas cylinder 26A to a pressure value designated by the target generation controller 27, and pressurizes the target substance TG in a molten state stored in the tank 22A of the target injector 22 by the depressurized gas.

The target generation controller 27 is connected with the piezoelectric power source 23A, the temperature controller 25, the pressure regulator 26, and the calculation unit 28. The target generation controller 27 controls the piezoelectric power source 23A, the temperature controller 25, and the pressure regulator 26 so as to discharge droplets DL of the target substance TG at intervals through the opening of the nozzle 22B of the target injector 22.

To the target generation controller 27, a droplet related signal S28 and a burst signal S1 are input. The droplet related signal S28 is a signal indicating information related to the droplet DL such as speed, volume, and the like of the droplet DL. The burst signal S1 is a signal defining a burst-on period in which EUV light is generated, and a burst-off period in which generation of EUV light is stopped. The burst-on period and the burst-off period are alternately repeated.

The target generation controller 27 controls the target injector 22 so as to regulate the discharge direction of the droplets DL, based on the burst signal S1 and the droplet related signal S28. The target generation controller 27 also controls the pressure regulator 26 so as to regulate the speed of the droplets DL, based on the burst signal S1 and the droplet related signal S28. Note that the control described above by the target generation controller 27 is a mere example. Other controls may be added as needed.

To the calculation unit 28, a passage timing signal S30 is input. The passage timing signal S30 is a signal indicating the timing that the droplet DL discharged at intervals through the opening of the nozzle 22B pass through a first point P1. The first point P1 is located on the nozzle 22B side from a plasma generating region AR in which the droplet DL is made into plasma, on a trajectory OT of the droplet DL discharged into the chamber 10.

The calculation unit 28 generates an imaging timing signal S29 indicating the timing that the droplet DL discharged at intervals through the opening of the nozzle 22B passes through a second point P2, based on the passage timing signal S30, and outputs the generated imaging timing signal S29. The second point P2 is between the first point P1 and the plasma generating region AR on the trajectory OT of the droplet DL.

To the calculation unit 28, an image signal S40 showing droplet images of two or more droplets DL is input at the imaging timing of the imaging timing signal S29. The calculation unit 28 generates the droplet related signal S28 based on the passage timing signal S30, the image signal S40, and the like.

The extreme ultraviolet light generation system 1 also includes a timing sensor unit 30 and a droplet image output unit 40.

The timing sensor unit 30 is configured to output the passage timing signal S30. For example, the timing sensor unit 30 may be configured of a light source unit 31 disposed on one side of a pair of windows W1 and W2 opposite to each other over the trajectory OT of the droplet DL, and a light receiving unit 35 disposed on the other side of the windows W1 and W2.

The light source unit 31 includes a container 32, a CW laser 33 and an illumination optical system 34 disposed in the container 32. The illumination optical system 34 radiates a laser beam emitted from the CW laser 33 to the first point P1 on the trajectory OT of the droplet DL through the window W1.

The light receiving unit 35 includes a container 36, a light receiving optical system 37 and an optical sensor 38 disposed in the container 36, and a counter circuit 39 connected to the optical sensor 38. The light receiving optical system 37 guides the light, made incident from the window W2 through the first point P1, to the optical sensor 38. The optical sensor 38 detects a change in the light caused when the droplet DL passes through the first point P1. The counter circuit 39 generates the passage timing signal S30 based on the signal output from the optical sensor 38, and outputs it to the calculation unit 28. The counter circuit 39 also counts the number of droplets that pass through the first point P1, based on the signal output from the optical sensor 38.

A droplet image output unit 40 is configured to output the image signal S40. For example, the droplet image output unit 40 may be configured of a light source unit 41 disposed on one side of a pair of windows W3 and W4 opposite to each other over the plasma generating region AR on the trajectory OT of the droplet DL, and a light receiving unit 45 disposed on the other side of the windows W3 and W4.

The light source unit 41 includes a container 42, a flash lamp 43 and an illumination optical system 44 disposed in the container 42. The flash lamp 43 is lit based on the imaging timing signal S29 output from the calculation unit

28. The illumination optical system 44 collimates the light obtained by the lighting of the flash lamp 43 to radiate the collimated light to the second point P2 through the window W3.

The light receiving unit 45 includes a container 46, a transfer optical system 47 and an image sensor 48 disposed in the container 46, and an image acquisition unit 49 connected to the image sensor 48. The transfer optical system 47 transfers the light, made incident from the window W4 through the second point P2, to the light receiving surface of the image sensor 48. The image sensor 48 opens and closes the shutter based on the imaging timing signal S29 output from the calculation unit 28. The image acquisition unit 49 acquires the light, transferred to the receiving surface when the shutter of the image sensor 48 is opened, as the image signal S40, and outputs the acquired image signal S40 to the calculation unit 28.

The extreme ultraviolet light generation system 1 also includes an EUV light generation controller 50 and a laser apparatus 60.

To the EUV light generation controller 50, the droplet related signal S28 is input from the calculation unit 28, and the burst signal S1 is input from an exposure apparatus not illustrated. The EUV light generation controller 50 generates a light emission trigger signal S50 based on the burst signal S1 and the droplet related signal S28, and outputs the generated light emission trigger signal S50 to the laser apparatus 60 to thereby control the laser apparatus 60 to perform burst operation. Burst operation means an operation of emitting a continuous pulsed laser beam L at a predetermined cycle in the burst-on period, and emission of the laser beam L is inhibited in the burst-off period.

The laser apparatus 60 is configured to emit a pulsed laser beam L. For example, the laser apparatus 60 may be configured of a solid-state laser such as Nd: YAG laser or Nd: YVO4 laser. Further, for example, the laser apparatus 60 may be configured of a gas laser such as $CO_2$ laser, an excimer laser, or the like. Note that the pulse width of the laser beam L may be a picosecond pulse width equal to or larger than 100 fs and smaller than 1 ns, or may be a nanosecond pulse width equal to or larger than 1 ns.

2.2 Operation

In order to heat the target substance stored in the tank 22A of the target injector 22, the target generation controller 27 supplies electric power from the heater power source 24A to the heater 24 to thereby drive the heater 24. The target generation controller 27 also allows the temperature controller 25 to regulate the electric power amount to be supplied from the heater power source 24A to the heater 24 such that the target substance TG stored in the tank 22A of the target injector 22 becomes a predetermined temperature equal to or higher than the melting point. When the target substance is tin, the predetermined temperature is a temperature within the temperature range from 250° C. to 290° C., for example.

Figure 2:
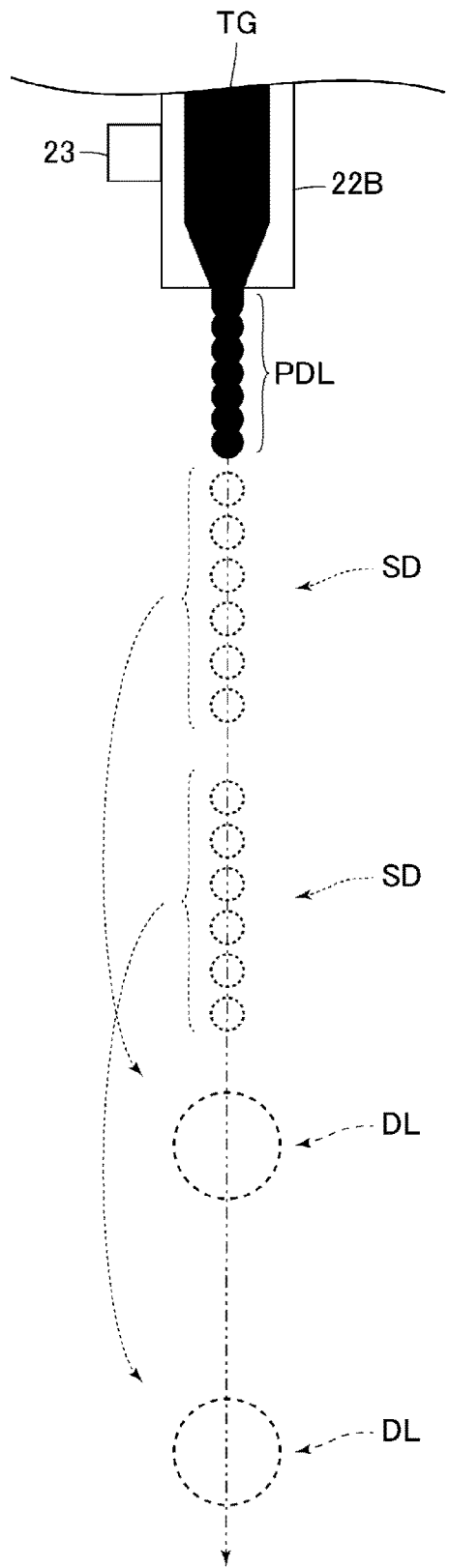
FIG. 2 is a diagram illustrating a state where droplets are discharged from a target injector.

The target generation controller 27 allows the pressure regulator 26 to regulate the pressure inside the tank of the target injector 22 such that the target substance TG in a molten state, stored in the tank 22A of the target injector 22, is emitted from the opening of the nozzle 22B at a predetermined speed. Through this regulation, as illustrated in FIG. 2, the target substance TG in a molten state is continuously emitted from the opening of the nozzle 22B of the target injector 22 at a predetermined speed, and a cylindrical precursor substance PDL that is a precursor of the droplet DL is generated. The cylindrical precursor substance PDL extends along the trajectory OT from the opening of the nozzle 22B in a state of being attached to the opening.

The target generation controller 27 supplies electric power from the piezoelectric power source 23A to the piezoelectric element 23 to drive the piezoelectric element 23. Thereby, the piezoelectric element 23 oscillates at a predetermined oscillation cycle, and the oscillation is propagated to the cylindrical precursor substance PDL via the nozzle 22B of the target injector 22. The cylindrical precursor substance PDL is divided into small droplets SD according to the oscillation cycle, and the small droplets SD are integrated on the way of traveling on the trajectory OT to thereby be discharged into the chamber 10 as the droplet DL.

In this way, by the continuous jet method that gives oscillation to the cylindrical precursor substance PDL continuously emitted from the opening of the nozzle 22B at a predetermined speed, the droplets DL of the target substance TG are discharged into the chamber 10 at intervals.

The droplet DL discharged into the chamber 10 is directed to the plasma generating region AR via the first point P1 and the second point P2. Here, the passage timing signal S30 showing the timing that the droplet DL passes through the first point P1 is generated by the timing sensor unit 30 and is output to the calculation unit 28. Further, the image signal S40 of the droplet DL captured at the timing when the droplet DL passes through the second point P2 is generated by the droplet image output unit 40 and is output to the calculation unit 28.

The calculation unit 28 generates the droplet related signal S28 based on the passage timing signal S30, the image signal S40, and the like, as described above. Then, the calculation unit 28 outputs the generated droplet related signal S28 to the target generation controller 27 and the EUV light generation controller 50.

The target generation controller 27 regulates the discharge direction, the discharge speed, and the like of the droplet DL based on the droplet related signal S28 and the burst signal S1 output from the EUV light generation controller 50 as described above.

The EUV light generation controller 50 generates the light emission trigger signal S50 based on the droplet related signal S28 and the burst signal S1, and outputs the generated light emission trigger signal S50 to the laser apparatus 60. The laser apparatus 60 emits a pulsed laser beam L at a predetermined cycle in the burst-on period, based on the light emission trigger signal S50.

The laser beam L is focused on the plasma generating region AR by a light focusing optical system CO. The laser beam L focused on the plasma generating region AR is applied to at least one droplet DL. The droplet DL irradiated with the laser beam L is made into plasma, and light containing EUV light is emitted from the plasma. The EUV light is selectively reflected by a reflecting surface of an EUV light focusing mirror not illustrated, and is output to an exposure apparatus not illustrated. Note that one droplet DL may be irradiated with a plurality of pulsed laser beams.

3. Description of Droplet Discharge Apparatus of Comparative Example

Next, a droplet discharge apparatus of a comparative example will be described. Note that the same components as those described above are denoted by the same reference numerals, and overlapping description is omitted unless otherwise particularly stated.

3.1 Configuration

To the calculation unit 28, the image signal S40 is input from the droplet image output unit 40, as described above. The calculation unit 28 periodically acquires the number of droplets from the counter circuit 39, and based on the acquired number of droplets and the image signal S40, calculates the consumption volume of the target substance TG.

3.2 Operation

Figure 3:
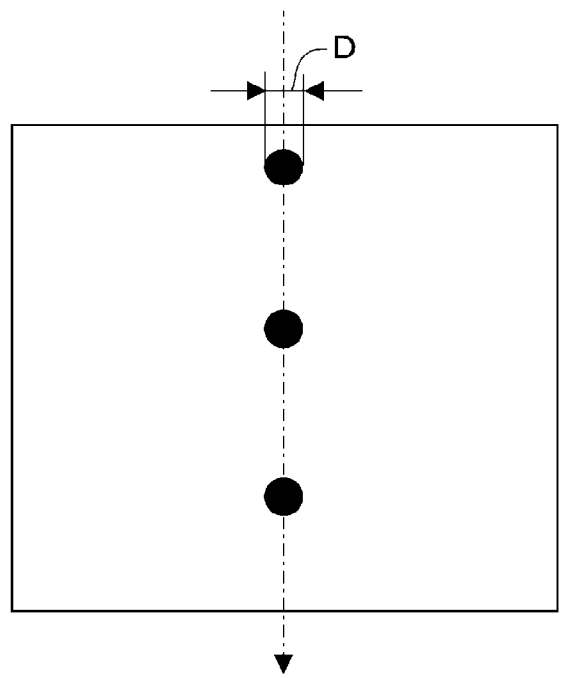
FIG. 3 is a schematic diagram illustrating a diameter of a droplet image in an image signal.

The calculation unit 28 measures a diameter D of a droplet image and calculates the volume of the droplet DL from the measured diameter, based on the image signal S40, as illustrated in FIG. 3. Note that the diameter D may be the diameter of one droplet image or an average of the diameters of a plurality of droplet images.

When the calculation unit 28 acquires the number of droplets from the counter circuit 39, the calculation unit 28 multiplies the acquired number of droplets by the volume of the droplet DL to thereby calculate the consumption volume of the target substance TG.

3.3 Problem

However, as the speed of the droplet DL discharged from the droplet discharge unit 21 is fast, the contour of a droplet image is likely to be unclear. Therefore, the diameter D of a droplet image tends to be measured in a larger size than the actual diameter of the droplet DL. Accordingly, it is concerned that the consumption volume of the target substance, calculated based on the diameter D of the droplet image, may be incorrect to be different from the actual consumption volume.

The consumption volume of the target substance is one of the important parameters for knowing the time to replace the target injector 22, or, knowing the time to replenish the target substance TG to the tank 22A of the target injector 22. Accordingly, it is required to accurately calculate the consumption volume of the target substance.

Therefore, in the embodiment described below, a droplet discharge apparatus and a calculation method capable of calculating the consumption volume of the target substance TG more accurately will be illustrated below as an example.

4. Description of Droplet Discharge Apparatus of Embodiment

Next, a droplet discharge apparatus of an embodiment will be described. Note that the same components as those described above are denoted by the same reference numerals, and overlapping description is omitted unless otherwise particularly stated.

4.1 Configuration

Figure 4:
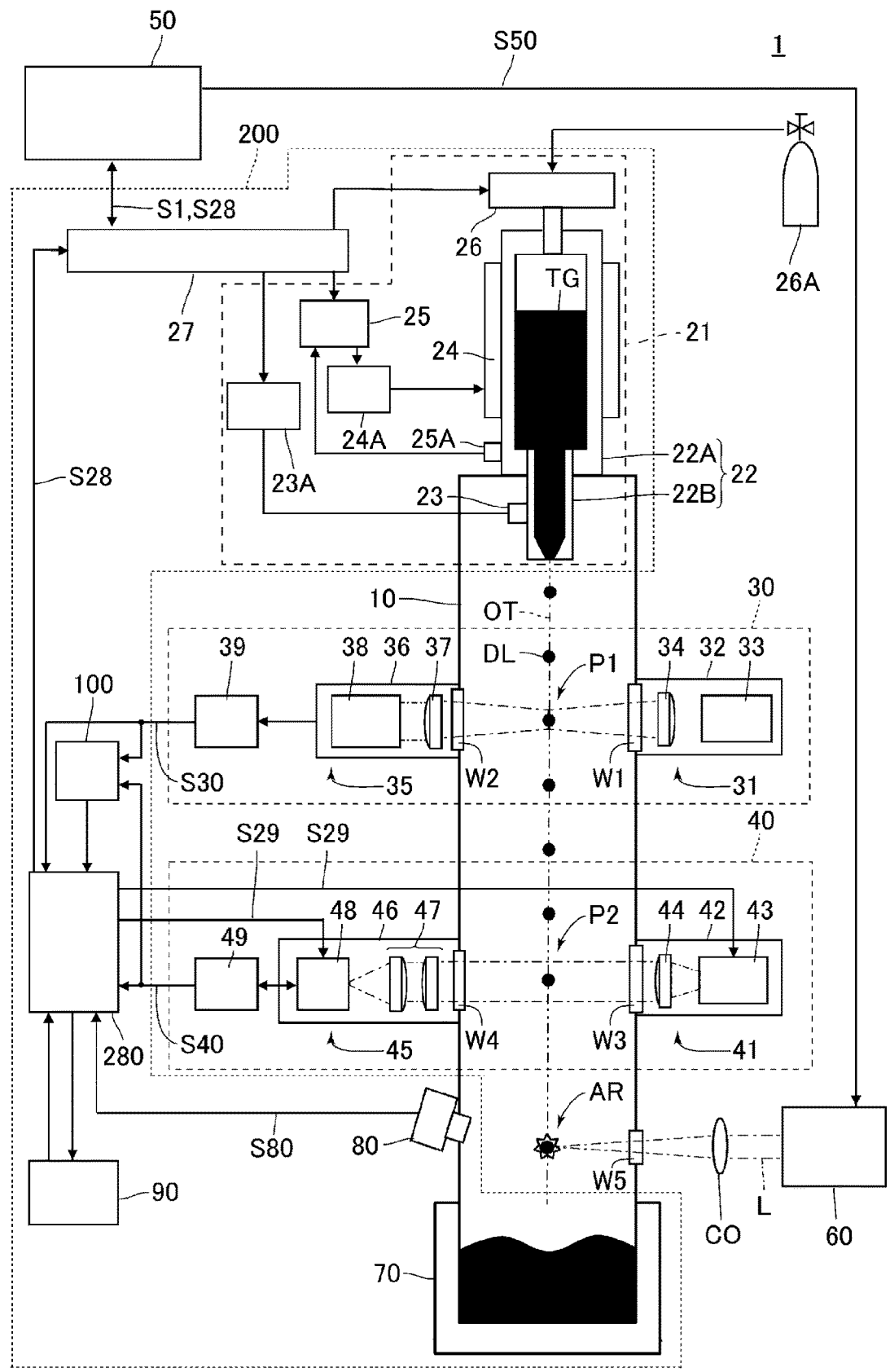
FIG. 4 is a schematic diagram illustrating a schematic configuration of the entire extreme ultraviolet light generation system of an embodiment.

FIG. 4 is a schematic diagram illustrating a schematic configuration of the entire extreme ultraviolet light generation system of an embodiment. As illustrated in FIG. 4, the extreme ultraviolet light generation system 1 of the present embodiment is equipped with a droplet discharge apparatus 200 having a configuration different from that of the above-described droplet discharge apparatus 20. In the extreme ultraviolet light generation system 1 of the present embodiment, the configuration other than the droplet discharge device 200 is the same as the configuration described above.

The droplet discharge apparatus 200 includes the droplet discharge unit 21 and the target generation controller 27 as configuration elements. The droplet discharge apparatus 200 further includes a droplet recovery unit 70 as a configuration element.

The droplet recovery unit 70 is to recover droplets DL which have not been made into plasma in the plasma generating region AR, among the droplets DL discharged from the droplet discharge unit 21. The droplet recovery unit 70 is disposed on the trajectory OT of the droplet DL. For example, the droplet recovery unit 70 is fixed to the chamber 10 in a state of communicating with the chamber 10 via an opening provided to a wall of the chamber 10 on the opposite side of the wall, of the chamber 10, on which the target injector 22 is mounted.

The droplet discharge apparatus 200 further includes an EUV energy sensor 80 as a configuration element.

The EUV energy sensor 80 is configured to output an EUV energy signal S80 indicating the energy of EUV light emitted when the droplet DL is made into plasma in the plasma generating region AR. For example, the EUV energy sensor 80 may be configured of an image sensor that outputs energy distribution of the EUV light as an image signal.

The droplet discharge apparatus 200 further includes an interface 90 as a configuration element.

The interface 90 is a connection part that connects the droplet discharge apparatus 200 and other apparatuses. The other apparatuses may be one or more. For example, operation input devices such as a mouse and a keyboard, an information storage medium such as a semiconductor memory, a communication device that exchanges information over a network, and a display device such as a liquid crystal display may be included.

The droplet discharge apparatus 200 further includes a speed sensor 100 as a configuration element.

The speed sensor 100 is configured to measure the speed of the droplet DL discharged from the droplet discharge unit 21. For example, to the speed sensor 100, the passage timing signal S30 is input from the timing sensor unit 30, and the image signal S40 is input from the droplet image output unit 40. The speed sensor 100 measures the speed of the droplet DL based on the passage timing signal S30 and the image signal S40.

Further, the droplet discharge apparatus 200 includes a calculation unit 280 in place of the calculation unit 28.

To the calculation unit 280, the passage timing signal S30 is input from the timing sensor unit 30, and the image signal S40 is input from the droplet image output unit 40.

Similar to the calculation unit 28, the calculation unit 280 generates the imaging timing signal S29 based on the passage timing signal S30, and outputs the generated imaging timing signal S29 to the droplet image output unit 40. Similar to the calculation unit 28, the calculation unit 280 generates the droplet related signal S28 based on the passage timing signal S30, the image signal S40, and the like, and outputs the generated droplet related signal S28 to the target generation controller 27.

Further, to the calculation unit 280, the EUV energy signal S80 is input from the EUV energy sensor 80. The calculation unit 280 calculates each of the droplet discharge remaining time, the target remaining amount, and the droplet recovery amount, based on the EUV energy signal S80, the speed of the droplet DL measured by the speed sensor 100, and the like.

The droplet discharge remaining time is a remaining time in which droplets DL can be discharged continuously from the droplet discharge unit 21. The target remaining amount is the volume of the target substance TG remaining in the tank 22A of the target injector 22. The droplet recovery amount is the volume of the droplets DL stored in the droplet recovery unit 70. The calculation unit 280 may calculate any one or two of the droplet discharge remaining time, the target remaining amount, and the droplet recovery amount.

4.2 Operation

Figure 5:
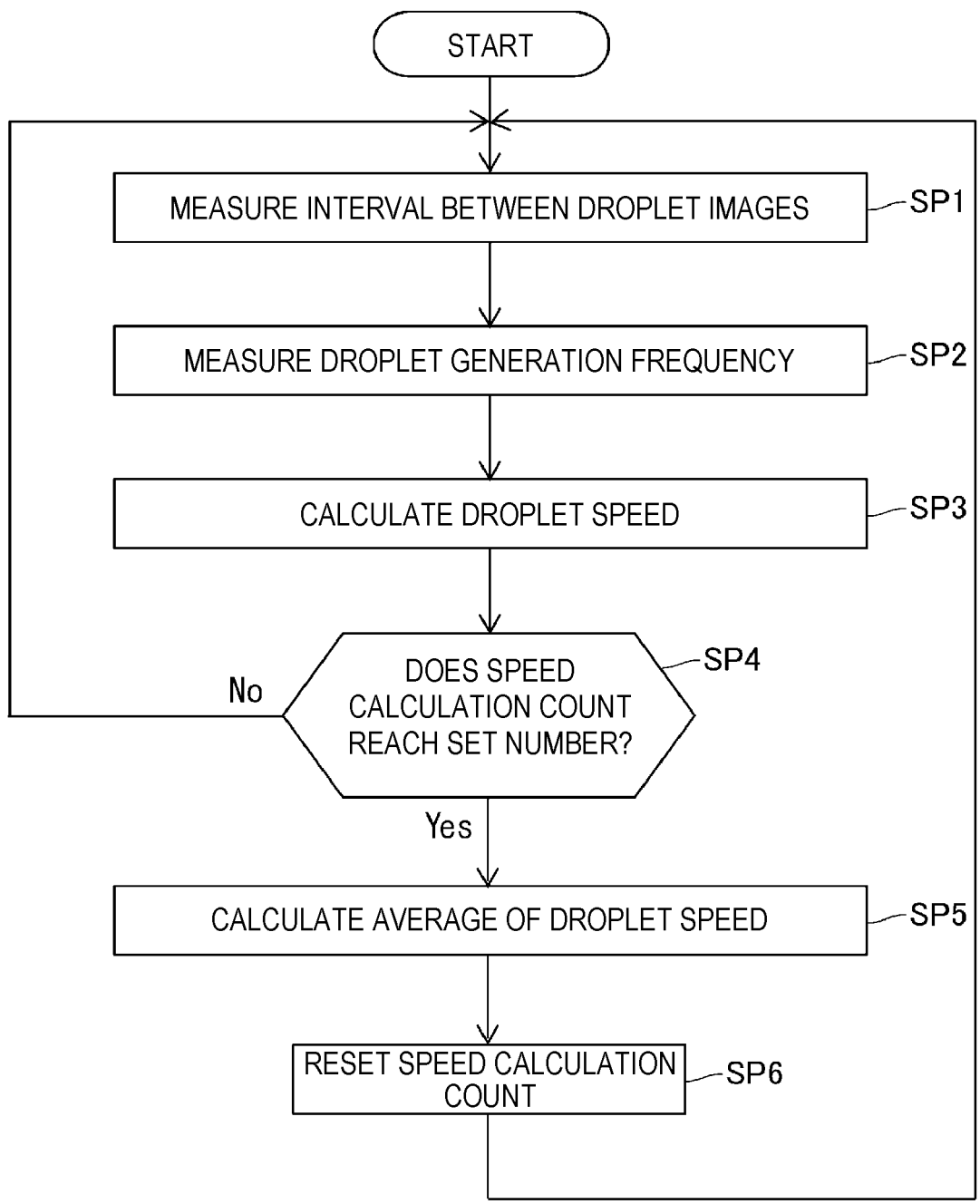
FIG. 5 is a flowchart illustrating a speed measurement routine of a speed sensor for measuring the speed of a droplet.

First, operation of the speed sensor 100 that measures the speed of the droplet DL will be described. FIG. 5 is a flowchart illustrating a speed measurement routine of a speed sensor for measuring the speed of a droplet.

As illustrated in FIG. 5, when the image signal S40 is input from the droplet image output unit 40, the speed sensor 100 starts a speed measurement routine and proceeds to step SP1.

Figure 6:
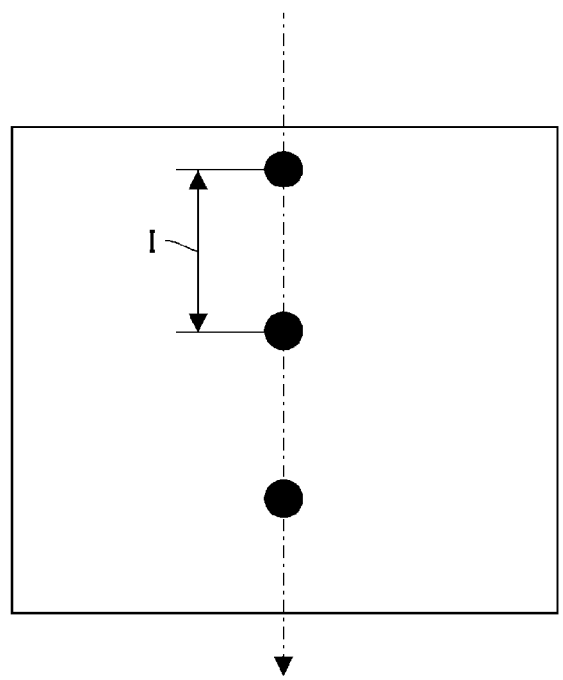
FIG. 6 is a schematic diagram illustrating a diameter of a droplet image in an image signal.

At step SP1, the speed sensor 100 measures an interval I between droplet images adjacent to each other based on the image signal S40 as illustrated in FIG. 6, and proceeds to step SP2. The interval I may be an interval between the centers of droplet images adjacent to each other, or an interval between those other than the centers. However, in the case where the interval I is an interval between the centers of droplet images adjacent to each other, even if the contours of the droplet images are unclear, the speed sensor 100 can acquire a value almost approximate to the interval between the actual droplets DL, from the droplet images. The interval I may also be an interval at one location between droplet images adjacent to each other, or an average of intervals of a plurality of locations between droplet images adjacent to each other. In the case where the interval I is an average of intervals of a plurality of locations between droplet images adjacent to each other, even if there is a slight difference in the actual interval between the droplets discharged from the droplet discharge unit 21, the speed sensor 100 can acquire a value almost approximate to the actual interval. The interval I typically ranges from 0.5 to 1 mm approximately.

At step SP2, the speed sensor 100 measures a droplet generation frequency. The droplet generation frequency is the number of droplets DL discharged per unit time, which is typically about 100 kHz.

For example, the speed sensor 100 may measure the droplet generation frequency based on the passage timing signal S30 output from the timing sensor unit 30. In the case where measurement is performed as described above, the number of droplets DL actually discharged per unit time is measured. Therefore, as compared with the case of storing the droplet generation frequency as a fixed value in a memory or the like in advance, the speed sensor 100 may accurately measure the droplet generation frequency. Note that the speed sensor 100 may acquire the number of droplets DL from the counter circuit 39.

Alternatively, the speed sensor 100 may measure the droplet generation frequency based on the oscillation cycle of the piezoelectric element 23, for example. In the case where measurement is performed as described above, it is unnecessary to measure the number of droplets DL actually discharged per unit time. Thus, the speed sensor 100 may reduce the processing load required for the measurement. The cycle of the piezoelectric element 23 is input by the interface 90 and is stored in the memory or the like of the speed sensor 100, for example.

Upon measurement of the droplet generation frequency of the droplet DL, the speed sensor 100 proceeds to step SP3. At step SP3, the speed sensor 100 calculates the speed of the droplet DL by multiplying the interval I measured at step SP1 by the generation frequency of the droplet DL measured at step SP2.

Upon calculation of the speed of the droplet DL, the speed sensor 100 proceeds to step SP4. At step SP4, the speed sensor 100 compares the current speed calculation count with the number set in advance.

Here, when the current speed calculation count is less than the set number, the speed sensor 100 increments the speed calculation count and then returns to step SP1 and calculates the speed of the droplet DL again.

In contrast, when the current speed calculation count reaches the set number, the speed sensor 100 proceeds to step SP5, and calculates an average from the speed of the droplets DL of the set number, and after storing the calculated speed of the droplet in the internal memory or the like and updates it, the speed sensor 100 proceeds to step SP6. At step SP6, the speed sensor 100 resets the speed calculation count to zero, and then returns to step SP1 to obtain the speed of the droplet DL.

As described above, the speed sensor 100 may calculate an average of the speed of the droplets DL at the imaging interval in the droplet image output unit 40, and store the calculated average of the speed of the droplets in the internal memory and update it. The imaging interval is typically about 100 ms. The update interval to update the average speed of the droplet DL is typically about 1 to several seconds.

Note that the speed sensor 100 may calculate only the speed of one droplet DL. However, as described above, in the case of measuring the number of droplets DL actually discharged per unit time as a droplet generation frequency, it is preferable to calculate an average speed of the droplets DL. The speed of the droplet DL may be calculated by using a statistical method other than average.

Figure 7:
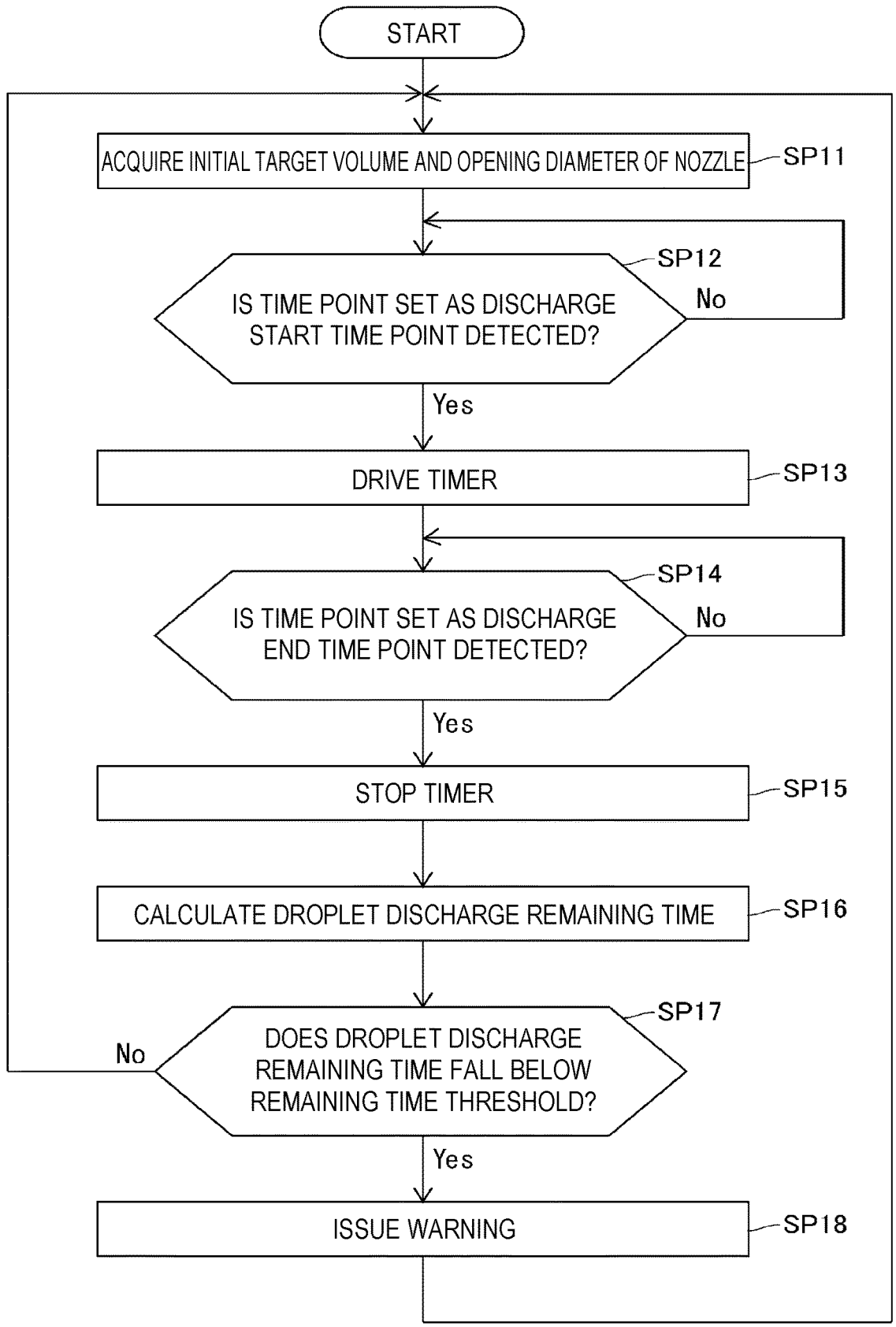
FIG. 7 is a flowchart illustrating a droplet discharge remaining time calculation routine performed by a calculation unit that calculates a droplet discharge remaining time.

Next, operation of the calculation unit 280 to calculate the droplet discharge remaining time will be described. FIG. 7 is a flowchart illustrating a droplet discharge remaining time calculation routine of a calculation unit that calculates a droplet discharge remaining time.

As illustrated in FIG. 7, the calculation unit 280 starts a droplet discharge remaining time calculation routine when it is activated, for example, and proceeds to step SP11.

At step SP11, the calculation unit 280 acquires the initial target volume and the opening diameter of the nozzle 22B of the target injector 22 via the interface 90. For example, the calculation unit 280 may acquire the initial target volume and the opening diameter of the nozzle 22B, input from the operation input device, through the interface 90. Alternatively, the calculation unit 280 may acquire the initial target volume and the opening diameter of the nozzle 22B by reading them from an information storage medium via the interface 90, for example. Alternatively, the calculation unit 280 reads a unique identifier of the target injector 22 from an information storage medium via the interface 90. Thereafter, the calculation unit 280 accesses a database server via the interface 90 to acquire the initial target volume and the opening diameter of the nozzle 22B corresponding to the identifier unique to the target injector 22.

Note that the initial target volume is the volume of the target substance TG stored in the tank 22A at a reference time point. In the present embodiment, the reference time point is a time point when the target injector 22 is replaced. The volume of the target substance TG that is stored in the tank 22A at that time typically ranges from 50 ml to 4000 ml, approximately. The reference time point may be a time point when the target substance TG in refilled in the tank 22A, or may be a time point specified by the operation input device through the interface 90.

When the calculation unit 280 acquires the initial target volume and the opening diameter of the nozzle 22B of the target injector 22, the calculation unit 280 proceeds to step SP12. At step SP 12, the calculation unit 280 waits until it detects the time point set as a discharge start time point of the droplet DL.

As the discharge start time point, a time point when a difference occurs in the number of droplets periodically acquired from the counter circuit 39 may be set. Alternatively, as the discharge start time point, a time point when passage of the droplet DL is started to be detected based on the passage timing signal S30 may be set, for example. Alternatively, as the discharge start time point, a time point when detection of a droplet image is started in the image signal S40 may be set, for example. Alternatively, as the discharge start time point, a time point when the internal pressure applied to the tank 22A is detected to be a predetermined pressure value or higher may be set, for example. The internal pressure may be detected based on an output of a pressure sensor, not illustrated, provided to the droplet discharge unit 21, for example.

When the calculation unit 280 detects the time point set as a discharge start time point of the droplet DL, the calculation unit 280 proceeds to step SP13. At step SP13, the calculation unit 280 drives the timer, and after starting measurement of the time from the time point detected at step SP 12, the calculation unit 280 proceeds to step SP14. At step SP 14, the calculation unit 280 waits until it detects the time point set as a discharge end time point of the droplet DL.

As the discharge end time point, a time point when a difference does not occur any more in the number of droplets periodically acquired from the counter circuit 39 may be set. Alternatively, as the discharge end time point, a time point when passage of the droplet DL is not detected any more based on the passage timing signal S30 may be set, for example. Alternatively, as the discharge end time point, a time point when a droplet image in the image signal S40 is not detected any more may be set, for example. Alternatively, as the discharge end time point, a time point when the internal pressure applied to the tank 22A is detected to be less than a predetermined pressure value may be set, for example. The internal pressure may be detected based on an output of a pressure sensor not illustrated provided to the droplet discharge unit 21 as described above, for example. Note that the time point when passage of the droplet DL is not detected any more and the time point when a droplet image is not detected any more are points of time after the same interval has passed from a discharged time point of the finally discharged droplet DL among the droplets DL discharged at almost constant interval.

When the calculation unit 280 detects the time point set as the discharge end time point of the droplet DL, the calculation unit 280 proceeds to step SP15. At step SP15, the calculation unit 280 stops the timer and acquires the discharge time from the time point detected at step SP 12 until the time point detected at step SP14, and then proceeds to step SP16.

At step SP16, the calculation unit 280 calculates the cross-sectional area of the nozzle 22B based on the opening diameter of the opening of the nozzle 22B acquired at step SP11, as a first stage. For example, when the opening diameter radius of the nozzle 22B acquired at step SP11 is a radius, and it is assumed that the radius is represented by r [μm], the calculation unit 280 can calculate the cross-sectional area [m$^2$] of the nozzle 22B by an expression ($\pi \times (r \div 1000000 \div 2)^2$).

As a second stage, the calculation unit 280 calculates the volume of the target substance TG consumed per unit time by multiplying the average speed of the droplets DL stored in the internal memory of the speed sensor 100 and the cross-sectional area of the nozzle 22B.

As described above with use of FIG. 2, the cylindrical precursor substance PDL is generated at a predetermined speed by the oscillation of the piezoelectric element 23, and further, the cylindrical precursor substance PDL is discharged as the droplet DL. Therefore, the speed of the droplet DL corresponds to the height of the cylindrical precursor PDL emitted per unit time. Therefore, by multiplying the speed of the droplet DL by the cross-sectional area of the nozzle 22B, the volume of the cylindrical precursor substance PDL that is a precursor of the droplet DL is obtained. Since the volume of the cylindrical precursor substance PDL is that emitted from the target substance TG stored in the tank 22A per unit time, it is the volume of the target substance TG consumed per unit time.

As a third stage, the calculation unit 280 calculates the droplet discharge remaining time, based on the volume of the target substance TG consumed per unit time, the initial target volume acquired at step SP11, and the discharge time acquired at step SP15.

For example, it is assumed that the initial target volume is represented by IV [m$^3$], the volume of the target substance TG consumed per unit time is represented by CV [m$^3$/s], and the discharge time is represented by H[s]. In that case, the calculation unit 280 calculates the droplet discharge remaining time from an expression (($IV \div CV \div 3600) - (H \div 3600)$)).

When the calculation unit 280 calculates the droplet discharge remaining time, it proceeds to step SP17. The calculation unit 280 may proceed to step SP17 after allowing the display device to display the droplet discharge remaining time via the interface 90. At step SP17, the calculation unit 280 compares the droplet discharge remaining time with a remaining time threshold set for the droplet discharge remaining time.

Here, when the droplet discharge remaining time is equal to or larger than the remaining time threshold, it is a state where the target substance TG stored in the tank 22A is sufficiently left, which means that the droplet discharge remaining time is sufficient. In that case, the calculation unit 280 returns to step SP11 and repeats the processing described above.

In contrast, when the droplet discharge remaining time falls below the remaining time threshold, it means that the residue of the target substance TG stored in the tank 22A is insufficient so that the time when the droplet DL cannot be discharged from the droplet discharge unit 21 any more is approaching. In that case, the calculation unit 280 proceeds to step SP18, and after issuing a warning from the display device via the interface 90, for example, returns to step SP11 and repeats the processing described above.

Figure 8:
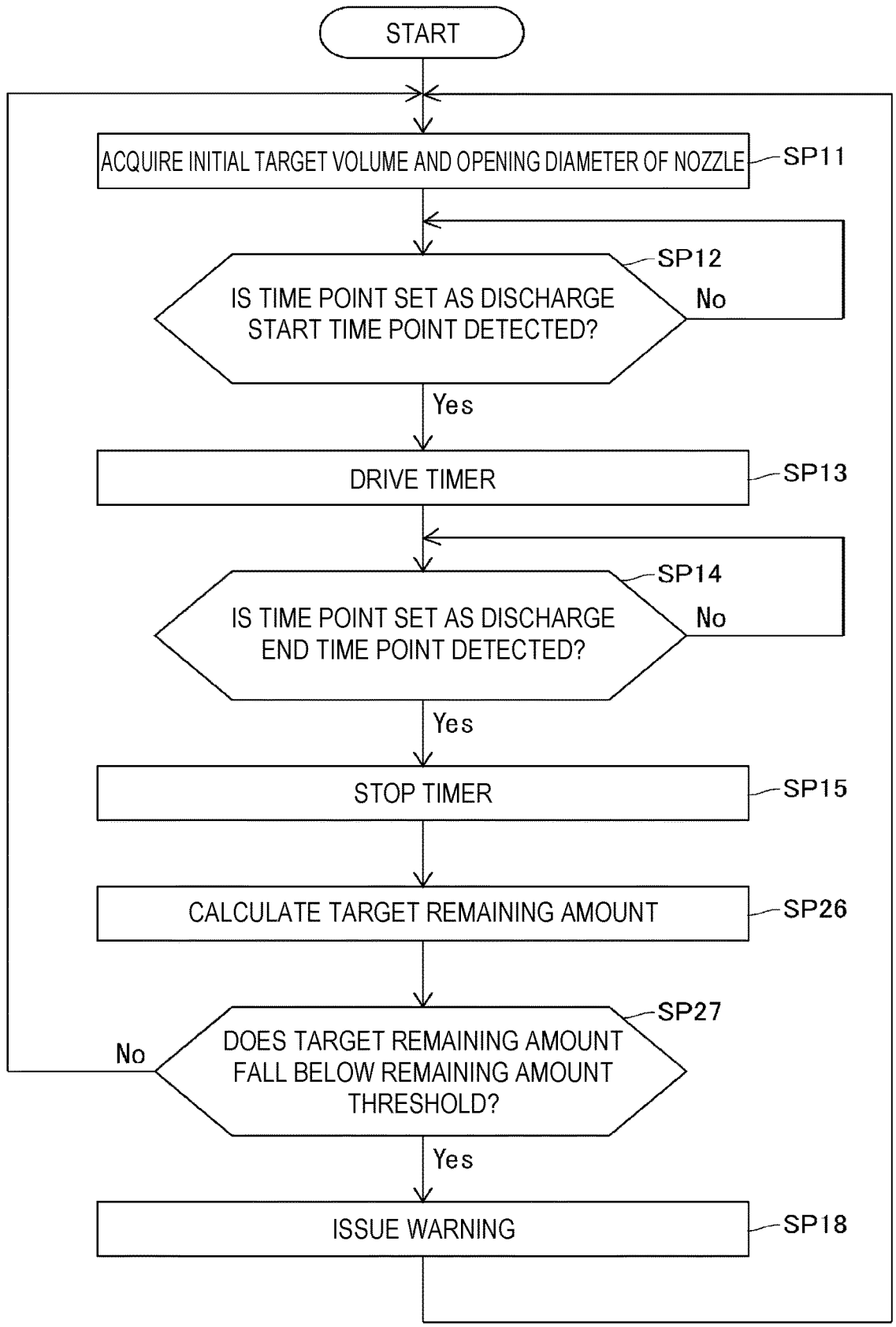
FIG. 8 is a flowchart illustrating a target remaining amount calculation routine of a calculation unit that calculates a remaining target amount.

Next, operation of the calculation unit 280 to calculate the target remaining amount will be described. FIG. 8 is a flowchart illustrating a target remaining amount calculation routine of the calculation unit that calculates a remaining target amount.

As illustrated in FIG. 8, when the calculation unit 280 is activated, for example, the calculation unit 280 starts the target remaining amount calculation routine, and proceeds to step SP11, and after acquiring the initial target volume and the opening diameter of the nozzle 22B through the interface 90, proceeds to step SP12.

At step SP12, the calculation unit 280 waits until it detects the time point set as a discharge start time point of the droplet DL. When detecting the time point, the calculation unit 280 proceeds to step SP13.

At step SP13, the calculation unit 280 drives the timer, and after starting measurement of the time from the time point detected at step SP 12, proceeds to step SP14 and waits until it detects the time point set as the discharge end time point of the droplet DL.

When the calculation unit 280 detects the time point set as the discharge end time point of the droplet DL, it proceeds to step SP15 and stops the timer, and acquires the discharge time from the time point detected at step SP 12 until the time point detected at step SP14, and then proceeds to step SP26.

At step SP26, as a first stage, the calculation unit 280 calculates the cross-sectional area of the nozzle 22B based on the opening diameter of the opening of the nozzle 22B acquired at step SP11.

As a second stage, the calculation unit 280 calculates the volume of the target substance TG consumed in the discharge time, based on the average speed of the droplets DL stored in the internal memory of the speed sensor 100, the cross-sectional area of the nozzle 22B, and the discharge time acquired at step SP15.

As described above, the speed sensor 100 typically updates the average speed of the droplets DL stored in the internal memory in almost one to several seconds. Therefore, even if the speed of the droplet DL is changed, the calculation unit 280 can calculate the volume of the target substance TG based on the changed average speed. Note that the speed sensor 100 may calculate the average speed of the droplets DL only once, and the calculation unit 280 may calculate the volume of the target substance TG by using the average speed as a fixed value.

As a third stage, the calculation unit 280 calculates the target remaining amount based on the volume of the target substance TG consumed in the discharge time and the initial target volume acquired at step SP11.

For example, on the assumption that the initial target volume is represented by IV [$m^3$] and the volume of the target substance TG consumed in the discharge time is represented by V [$m^3$], the calculation unit 280 can calculate the target remaining amount by an expression ((IV-V)÷(IV÷100)).

After calculating the target remaining amount, the calculation unit 280 proceeds to step SP27. The calculation unit 280 may proceed to step SP27 after allowing the display device to display the calculated target remaining amount via the interface 90. At step SP27, the calculation unit 280 compares the target remaining amount with a remaining amount threshold set for the target remaining amount.

Here, when the target remaining amount is equal to or larger than the remaining amount threshold, it means that the target substance TG stored in the tank 22A is sufficiently left. In that case, the calculation unit 280 returns to step SP11 and repeats the processing described above.

In contrast, when the target remaining amount falls below the remaining amount threshold, it means that the remaining amount of the target substance TG stored in the tank 22A is insufficient. In that case, the calculation unit 280 proceeds to step SP18, and after issuing a warning from the display device via the interface 90, for example, returns to step SP11 and repeats the processing described above.

Next, operation of the calculator 280 to calculate the droplet recovery amount will be described. FIG. 9 is a flowchart illustrating a droplet recovery amount calculation routine of a calculation unit that calculates a droplet recovery amount.

As illustrated in FIG. 9, when the calculation unit 280 is activated, for example, the calculation unit 280 starts the droplet recovery amount calculation routine, and proceeds to step SP11, and after acquiring the initial target volume and the opening diameter of the nozzle 22B via the interface 90, proceeds to step SP12.

At step SP12, the calculation unit 280 waits until it detects the time point set as a discharge start time point of the droplet DL. When detecting the time point, the calculation unit 280 proceeds to step SP33.

At step SP33, the calculation unit 280 drives the timer, and starts measurement of the time from the time point detected at step SP 12. The calculation unit 280 also starts measurement of the number of plasma droplets per unit time, based on the EUV energy signal S80 output from the EUV energy sensor 80. The number of plasma droplets per unit time is the number of droplets made into plasma in the plasma generating region AR per unit time.

Then, the calculation unit 280 proceeds to step SP14, and waits until it detects the time point set as a discharge end time point of the droplet DL. When detecting the time point set as the discharge end time point of the droplet DL, the calculation unit 280 proceeds to step SP35.

At step SP35, the calculation unit 280 stops the timer and acquires the discharge time from the time point detected at step SP 12 until the time point detected at step SP14. The calculation unit 280 also acquires the number of plasma droplets per unit time, and ends the measurement of the number of plasma droplets per unit time. Then, the calculation unit 280 proceeds to step SP36.

At step SP36, the calculation unit 280 calculates the cross-sectional area of the nozzle 22B based on the opening diameter of the opening of the nozzle 22B acquired at step SP11, as a first stage.

As a second stage, the calculation unit 280 calculates the volume of the target substance TG consumed in the discharge time, based on the average speed of the droplets DL stored in the internal memory of the speed sensor 100, the cross-sectional area of the nozzle 22B, and the discharge time acquired at step SP15.

As described above, the speed sensor 100 typically updates the average speed of the droplets DL stored in the internal memory in almost one to several seconds. Therefore, even if the speed of the droplet DL is changed, the calculation unit 280 can calculate the volume of the target substance TG based on the changed average speed. Note that the speed sensor 100 may calculate the average speed of the droplets DL only once, and the calculation unit 280 may calculate the volume of the target substance TG by using the average speed as a fixed value.

As a third stage, the calculation unit 280 calculates the volume of the droplets DL made into plasma in the discharge time, based on the number of plasma droplets per unit time acquired at step SP35. For example, it is assumed that the volume of the target substance TG consumed in the discharge time is represented by TV [$m^3$], the number of plasma droplets per unit time is represented by TPN [1/s], and the aforementioned droplet generation frequency is represented by DF [kHz]. In that case, the calculation unit 280 may calculate the volume by an expression (TV×(TPN÷DF)).

As a fourth stage, the calculation unit 280 calculates the droplet recovery amount by subtracting the volume of the droplets DL made into plasma in the discharge time from the volume of the target material TG consumed in the discharge time.

After calculating the droplet recovery amount, the calculation unit 280 proceeds to step SP37. Note that the calculation unit 280 may proceed to step SP37 after allowing the display device to display the droplet recovery amount via the interface 90. At step SP37, the calculation unit 280 compares the droplet recovery amount with a first recovery amount threshold set for the droplet recovery amount.

Here, when the droplet recovery amount is less than the first recovery amount threshold, it means that the recovery amount of the droplet recovered by the droplet recovery unit 70 is small so that further recovery can be made sufficiently by the droplet recovery unit 70. In that case, the calculation unit 280 returns to step SP11 and repeats the processing described above.

In contrast, when the droplet recovery amount is equal to or larger than the first recovered amount threshold, the calculation unit 280 proceeds to step SP38 and compares the droplet recovery amount with a second recovery amount threshold that is larger than the first recovery amount threshold.

Here, if the droplet recovery amount is equal to or larger than the first recovery amount threshold and is smaller than the second recovery amount threshold, the recovery amount of the droplet recovered by the droplet recovery unit 70 is increased but it is still possible to perform recovery by the droplet recovery unit 70 to some extent. In that case, the calculation unit 280 proceeds to step SP18, and for example, after issuing a warning from the display device via the interface 90, returns to step SP11.

Meanwhile, if the droplet recovery amount is equal to or larger than the second recovery amount threshold, the recovery amount of the droplet recovered by the droplet recovery unit 70 becomes close to the upper limit of the droplet recovery unit 70. Then, it is concerned that if recovery is continued by the droplet recovery unit 70, the droplets DL that are no longer recovered by the droplet recovery unit 70 may adhere to the optical element so that the reflectance and transmittance of the optical element are changed. In that case, the calculation unit 280 proceeds to step SP39, and by giving a stop command to the target generation controller 27, stops discharging performed by the droplet discharge unit 21 via the target generation controller 27 to thereby end the droplet recovery amount calculation routine.

Note that the calculation unit 280 measures the number of plasma droplets per unit time based on the EUV energy signal S80 output from the EUV energy sensor 80 as described above, and from the measurement result, calculates the volume of the droplets DL made into plasma in the discharge time. Since the number of droplets actually made into plasma per unit time is measured, the calculation unit 280 can accurately measure the volume of the droplets DL made into plasma in the discharge time. However, the calculation unit 280 may calculate the volume of the droplets DL made into plasma in the discharge time, based on the burst signal S1.

For example, it is assumed that the volume of the target substance TG consumed in the discharge time is represented by TV [m$^3$], and the droplet generation frequency is represented by DF [kHz]. Moreover, the proportion of the burst-on period relative to the total period of the burst-on period and the burst off period in the burst signal S1 is represented by Duty [%], and the cycle in which the laser apparatus 60 emits laser beam L is represented by LP [kHz]. In that case, the calculation unit 280 may calculate the volume by an expression (TV−(TV×{LP×Duty÷100})÷DF). The cycle that the laser apparatus 60 emits the laser beam L may be acquired from the laser apparatus 60, or may be read from an information storage medium via the interface 90. Further, the burst signal S1 may be acquired from the EUV light generation controller 50, or may be read from an information storage medium via the interface 90.

As described above, the calculation unit 280 can calculate the volume of the droplets DL made into plasma in the discharge time, based on the burst signal S1. In such a case, it is unnecessary to measure the number of plasma droplets per unit time at step SP33 and step SP35. Therefore, the calculation unit 280 can reduce the processing load required for the measurement.

4.3 Effect

As described above, the droplet discharge apparatus 20 of the present embodiment includes the droplet discharge unit 21, the speed sensor 100, and the calculation unit 280. The droplet discharge unit 21 discharges the droplets DL of the target substance TG stored in the tank 22A at intervals, through the opening of the nozzle 22B connected to the tank 22A. The speed sensor 100 measures the speed of the droplet DL discharged from the droplet discharge unit 21. The calculation unit 280 calculates the volume of the target substance TG consumed per unit time based on the cross-sectional area of the opening of the nozzle 22B and the speed of the droplet DL.

The cross-sectional area of the opening of the nozzle 22B can be registered in advance in the internal memory or the like. The speed of the droplet DL can be acquired without using an image, based on the interval or the cycle of discharging the droplets DL by the droplet discharge unit 21. Accordingly, the calculation unit 280 can calculate the volume of the target substance TG consumed per unit time based on the cross-sectional area of the opening of the nozzle 22B and the speed of the droplet DL, regardless of whether or not the contour of a droplet image is unclear. Therefore, the droplet discharge apparatus 20 capable of calculating the consumption volume of the target substance TG more accurately can be realized.

The droplet discharge unit 21 of the present embodiment discharges the droplets DL by a continuous jet method. Therefore, it is possible to discharge the droplets DL having almost uniform volume at almost the same speed.

Further, the speed sensor 100 of the present embodiment calculates the speed of the droplet DL based on the interval I between droplet images measured from the image signal S40 of the droplet DL, and the number of droplets DL discharged per unit time. The Interval I between droplet images is almost approximate to the actual interval between the droplets DL, regardless of whether or not the contour of the droplet image is unclear. When the interval I between droplet images is an interval between the centers of the droplet images, it is further approximate to the actual interval between the droplets DL. Accordingly, even if droplet images are used, the speed sensor 100 can measure the accurate speed of the droplet DL approximate to the actual speed.

Furthermore, the calculation unit 280 of the present embodiment calculates the volume of the target substance TG consumed per unit time, based on the speed of the droplet DL, the time from the time point set as the discharge start time point, and the cross-sectional area of the opening of the nozzle 22B. The droplets DL are discharged by the continuous jet method. As described with use of FIG. 2, in the continuous jet method, the cylindrical precursor substance PDL is generated at a predetermined speed by the oscillation of the piezoelectric element 23, and further, the cylindrical precursor substance PDL is discharged as the droplets DL. Therefore, the speed of the droplet DL corresponds to the height of the cylindrical precursor PDL emitted per unit time. Accordingly, by multiplying the speed of the droplet DL by the cross-sectional area of the nozzle 22B, the volume of the cylindrical precursor substance PDL that is a precursor of the droplet DL is obtained. Thereby, the calculation unit 280 can acquire, through calculation, the volume of the target substance TG consumed in the time from the time point set as the discharge start time, based on the droplets DL that are actually discharged. Therefore, as compared with the case of calculating the volume of the target substance TG by using the speed of the droplet DL as a fixed value, it is possible to calculate the volume of the target substance TG accurately.

Further, the calculation unit 280 of the present embodiment calculates the droplet discharge remaining time, based on the initial target volume, the volume of the target substance TG consumed per unit time, and the time from the time point set as the discharge start time point of the droplets DL.

As described above, as the calculation unit 280 can accurately calculates the volume of the target substance TG, it can calculate the droplet discharge remaining time from the accurate volume of the target substance TG. Therefore, by issuing a warning when the droplet discharge remaining time falls below the remaining amount threshold, the calculation unit 280 can accurately notify the user of the time to replace the target injector 22, or the time to refill the tank 22A of the target injector 22 with the target substance TG.

Further, the calculation unit 280 of the present embodiment calculates the target remaining amount, based on the initial target volume, and the volume of the target substance TG consumed in the time from the time point set as the discharge start time point of the droplets DL.

As described above, as the calculation unit 280 can accurately calculate the volume of the target substance TG, it is possible to calculate the accurate target remaining amount. Therefore, by issuing a warning when the target remaining amount falls below the remaining amount threshold, the calculation unit 280 can accurately notify the user of the time to replace the target injector 22 or the time to refill the tank 22A of the target injector 22 with the target substance TG.

Further, the droplet discharge apparatus 20 of the present embodiment is provided with the droplet recovery unit 70 disposed on the trajectory OT of the droplet DL discharged from the droplet discharge unit 21. The calculation unit 280 calculates the droplet recovery amount, based on the volume of the target substance TG consumed in the time from the time point set as the discharge start time point of the droplets DL, and the volume of the droplets DL made into plasma in the time.

As described above, since the calculation unit 280 can accurately calculate the volume of the target substance TG, it is possible to calculate the accurate droplet recovery amount. Accordingly, by issuing a warning when the droplet recovery amount is equal to or larger than the first recovery amount threshold and is smaller than the second recovery amount threshold, the calculation unit 280 can accurately notify the user of the time to replace the droplet recovery unit 70. Further, by stopping discharging performed by the droplet discharge unit 21 when the droplet recovery amount is equal to or larger than the second recovery amount threshold by the calculation unit 280, it is possible to prevent the droplets DL that are no longer recovered by the droplet recovery unit 70 from adhering to the optical element.

Note that the opening diameter of the opening of the nozzle 22B may differ depending on the type of the target injector 22. To the calculation unit 280 of the present embodiment, the opening diameter of the opening of the nozzle 22B is input, and the calculation unit 280 calculates the cross-sectional area of the nozzle 22B based on the opening diameter. Therefore, the calculation unit 280 can accurately calculate the cross-sectional area of the nozzle 22B based on the opening diameter corresponding to the type of the target injector 22.

The description provided above is intended to provide not limitations but mere examples. Accordingly, it will be obvious to those skilled in the art that changes can be made to the embodiments and modifications of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be held". Moreover, an indefinite article "a/an" described in the present description and in the accompanying claims should be construed to mean "at least one" or "one or more".

What is claimed is:

1. A droplet discharge apparatus comprising:
    a droplet discharge unit configured to discharge droplets of a target substance stored in a tank at intervals through an opening of a nozzle connected to the tank;
    a speed sensor configured to measure a speed of a droplet discharged from the droplet discharge unit;
    a calculation unit configured to calculate a volume of the target substance consumed per unit time based on a cross-sectional area of the opening of the nozzle and the speed of the droplet, and calculate a volume of the target substance consumed in a time from a time point set as a discharge start time point of the droplets based on the cross-sectional area of the opening of the nozzle, the speed of the droplet, and the time; and
    a droplet recovery unit that is disposed on a trajectory of the droplets discharged from the droplet discharge unit, wherein
    the calculation unit calculates a volume of the droplets stored in the droplet recovery unit by subtracting a volume of the droplets made into plasma in the time from the volume of the target substance consumed in the time.

2. The droplet discharge apparatus according to claim 1, wherein
    the droplet discharge unit discharges the droplets by a continuous jet method.

3. The droplet discharge apparatus according to claim 2, wherein
    the speed sensor calculates the speed of the droplet based on an interval between droplet images measured from an image signal of two or more of the droplets discharged at intervals, and a number of droplets discharged per unit time.

4. The droplet discharge apparatus according to claim 3, wherein
the interval between the droplet images is an average of the intervals between droplet images adjacent to each other.

5. The droplet discharge apparatus according to claim 3, wherein
the speed sensor measures the number of droplets discharged per the unit time, based on a passage timing signal indicating a timing of passage of each of the droplets discharged at intervals.

6. The droplet discharge apparatus according to claim 3, wherein
the speed sensor measures the number of droplets discharged per the unit time, based on an oscillation cycle applied to the target substance that is emitted continuously from the opening of the nozzle at a predetermined speed.

7. The droplet discharge apparatus according to claim 1, wherein
as the discharge start time point, one of followings is set:
a time point when a difference occurs in a number of droplets periodically acquired from a counter circuit that counts the droplets based on a passage timing signal indicating a timing of passage of each of the droplets discharged at intervals;
a time point when passage of the droplet is detected based on the passage timing signal;
a time point when a droplet image is detected in an image signal of the droplet; and
a time point when an internal pressure applied to the tank is detected to be a predetermined pressure value or higher.

8. The droplet discharge apparatus according to claim 1, wherein
the time is a discharge time from a time point set as the discharge start time point of the droplets until a time point set as a discharge end time point of the droplets.

9. The droplet discharge apparatus according to claim 8, wherein
as the discharge end time point, one of followings is set:
a time point when a difference does not occur any more in a number of droplets periodically acquired from a counter circuit that counts the droplets based on a passage timing signal indicating a timing of passage of each of the droplets discharged at intervals;
a time point when passage of the droplet is not detected any more based on the passage timing signal;
a time point when a droplet image is not detected any more in an image signal of the droplet; and
a time point when an internal pressure applied to the tank is detected to be lower than a predetermined pressure value.

10. The droplet discharge apparatus according to claim 1, wherein
the calculation unit calculates a remaining time in which the droplets are allowed to be discharged continuously from the droplet discharge unit after a reference time point, based on a volume of the target substance stored in the tank at the reference time point, the volume of the target substance consumed per the unit time, and the time from the time point set as the discharge start time point of the droplets.

11. The droplet discharge apparatus according to claim 1, wherein
the calculation unit calculates the volume of the target substance remaining in the tank after the reference time point, based on a volume of the target substance stored in the tank at the reference time point and the volume of the target substance consumed in the time.

12. The droplet discharge apparatus according to claim 1, wherein
a number of the droplets made into plasma per unit time is measured based on an EUV energy signal indicating energy of extreme ultraviolet light radiated by the droplets being made into plasma, and the volume of the target substance consumed in the time is calculated from a result of the measurement.

13. The droplet discharge apparatus according to claim 1, wherein
the volume of the droplets made into plasma in the time is measured based on a burst signal that designates a burst-on period in which extreme ultraviolet light is generated and a burst-off period in which generation of the extreme ultraviolet light is stopped.

14. The droplet discharge apparatus according to claim 13, wherein
the volume of the droplets made into plasma in the time is measured, based on a ratio of the burst-on period to a total period of the burst-on period and the burst-off period, and a cycle of emitting a laser beam by a laser apparatus in the burst-on period.

15. The droplet discharge apparatus according to claim 1, wherein
the calculation unit issues a warning when the volume of the droplets stored in the droplet recovery unit is equal to or larger than a first recovery amount threshold and is smaller than a second recovery amount threshold that is larger than the first recovery amount threshold.

16. The droplet discharge apparatus according to claim 15, wherein
when the volume of the droplets stored in the droplet recovery unit is equal to or larger than the second recovery amount threshold, the calculation unit causes the droplet discharge unit to stop discharging.

17. The droplet discharge apparatus according to claim 1, wherein
an opening diameter of the opening of the nozzle is input to the calculation unit, and
the calculation unit calculates the cross-sectional area of the nozzle based on the opening diameter.

18. A calculation method comprising:
measuring a speed of a droplet of a target substance stored in a tank discharged at intervals through an opening of a nozzle connected to the tank,
calculating a volume of the target substance consumed per unit time based on a cross-sectional area of the opening of the nozzle and the speed of the droplet,
calculating a volume of the target substance consumed in a time from a time point set as a discharge start time point of the droplets based on the cross-sectional area of the opening of the nozzle, the speed of the droplet, and the time; wherein
a droplet recovery unit is disposed on a trajectory of the discharged droplets such that a volume of the droplets stored in the droplet recovery unit is calculated by subtracting a volume of the droplets made into plasma in the time from the volume of the target substance consumed in the time.

* * * * *